United States Patent
Kayano (10) Patent No.: US 10,292,293 B2
(45) Date of Patent: May 14, 2019

(54) ELECTRONIC APPARATUS

(71) Applicant: DENSO CORPORATION, Kariya, Aichi-pref. (JP)

(72) Inventor: Masayoshi Kayano, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/571,970

(22) PCT Filed: May 24, 2016

(86) PCT No.: PCT/JP2016/002513
§ 371 (c)(1),
(2) Date: Nov. 6, 2017

(87) PCT Pub. No.: WO2016/199361
PCT Pub. Date: Dec. 15, 2016

(65) Prior Publication Data
US 2018/0146567 A1 May 24, 2018

(30) Foreign Application Priority Data
Jun. 8, 2015 (JP) ................. 2015-115959

(51) Int. Cl.
*H05K 7/14* (2006.01)
*H02B 1/26* (2006.01)

(52) U.S. Cl.
CPC ............. *H05K 7/14* (2013.01); *H02B 1/26* (2013.01); *H05K 7/1417* (2013.01)

(58) Field of Classification Search
CPC ........................................... H05K 7/142
USPC ............................................. 361/600
See application file for complete search history.

(56) References Cited

U.S. PATENT DOCUMENTS 6,094,349 A * 7/2000 Fassel ............... H05K 3/284
165/80.2
2002/0148641 A1 10/2002 Minami et al.

FOREIGN PATENT DOCUMENTS

| JP | S62005691 U | 1/1987 |
| JP | H04363098 A | 12/1992 |
| JP | 2014080069 A | 5/2014 |
| WO | WO-2002017693 A1 | 2/2002 |
| WO | WO-2011089655 A1 | 7/2011 |

* cited by examiner

*Primary Examiner* — Mukundbhai G Patel
(74) *Attorney, Agent, or Firm* — Harness, Dickey & Pierce, P.L.C.

(57) ABSTRACT

An electronic apparatus includes an electronic substrate on which an electronic component is mounted, and a cover that retains the electronic substrate, which is inserted along its plate surface direction. An insertion opening, into which the electronic substrate is capable of being inserted, is formed between a second guide part and a first guide part. The first guide part and the second guide part are arranged to be shifted from each other in a planar direction of a tabular flat plate part. The second guide part is located further in an insertion direction, in which the electronic substrate is inserted, than the first guide part.

7 Claims, 9 Drawing Sheets

PRIOR ART

ELECTRONIC APPARATUS

CROSS REFERENCE TO RELATED APPLICATIONS

This application is a U.S. National Phase Application under 35 U.S.C. 371 of International Application No. PCT/JP2016/002513 filed on May 24, 2016 and published in Japanese as WO 2016/199361 A1 on Dec. 15, 2016. This application is based on and claims the benefit of priority from Japanese Patent Application No. 2015-115959 filed on Jun. 8, 2015. The entire disclosures of all of the above applications are incorporated herein by reference.

TECHNICAL FIELD

The present disclosure relates to an electronic apparatus that retains an electronic substrate in a cover.

BACKGROUND ART

When an electronic substrate is assembled into a cover, attention has to be paid so that electronic components mounted over the electronic substrate may not interfere with the cover. To that end, an electronic apparatus having a mechanism to restrain interference between electronic components and a cover is desired.

For example, in a printed board fixation structure described in Patent Document 1, a pair of claws having a tapered shape is formed in a fixed body to fix a printed board. Then the paired claws are disposed so as to face each other in the normal directions of the fixed body and a printed board is inserted slidably into a groove between the paired claws. By disposing a pair of claws so as to be able to prevent interference between a fixed body and an operation part during assembly, a manufacturer can assemble a printed board only by slidably inserting the printed board into a groove without interference between the fixed body and the operation part.

PRIOR ART DOCUMENT

Patent Document

Patent Document 1: JPH4-363098A

Figure 17:
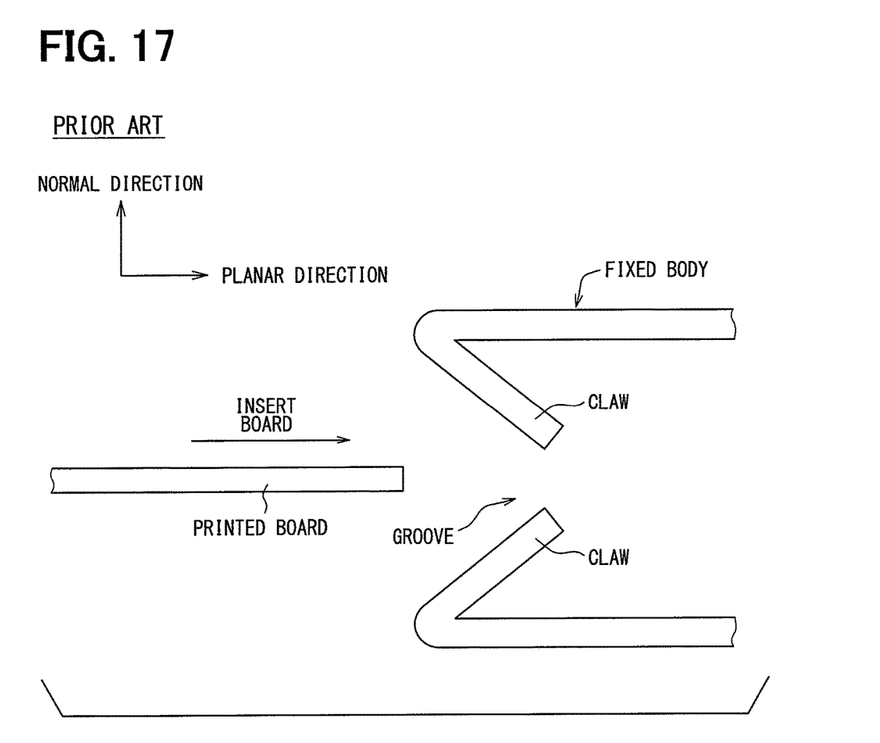
FIG. 17 is an explanatory diagram of prior art.

In an electronic apparatus described in Patent Document 1 however, a pair of taper-shaped claws is arranged opposite to each other in the normal directions of a fixed body. As a result, as shown in FIG. 17, the insertion direction where a printed board is inserted into a groove between the paired claws is limited to a direction perpendicular to the directions where the paired claws face each other, namely to a planar direction of a fixed body. A resultant problem is that the insertion of a printed board from various directions is restricted by the claws.

SUMMARY OF INVENTION

The present disclosure addresses the above issues. Thus, it is an objective of the present disclosure to provide an electronic apparatus that allows an electronic substrate to be inserted from various directions.

To achieve the objective, an electronic apparatus in an aspect of the present disclosure includes an electronic substrate on which an electronic component is mounted, and a cover that retains the electronic substrate, which is inserted along its plate surface direction. The cover includes a tabular flat plate part, a first guide part protruding from the flat plate part and extending out to be inclined relative to a planar direction of the flat plate part, and a second guide part that is located further away from the flat plate part than the first guide part and that extends out in a direction opposite from a direction in which the first guide part extends out in the planar direction to be inclined relative to the planar direction. An insertion opening, into which the electronic substrate is capable of being inserted, is formed between the second guide part and the first guide part. The first guide part and the second guide part are arranged to be shifted from each other in the planar direction. The second guide part is located further in an insertion direction, in which the electronic substrate is inserted, than the first guide part.

According to the electronic apparatus in this aspect, the first guide parts and second guide parts are formed obliquely to the planar direction of the flat plate part and are arranged in order of the first guide parts and then the second guide parts in the direction of inserting the electronic substrate. Consequently, when an electronic substrate inserted along a plate surface direction is retained in a cover for example, the first guide parts and the second guide parts play the role of guides. As a result, a process of inserting the electronic substrate between the first guide parts and the second guide parts can be undergone smoothly. Further, the first guide parts and the second guide parts forming the insertion openings for the electronic substrate are arranged in the manner of being displaced from each other in a planar direction. As a result, the frontages of the insertion openings are wider in comparison with the case of arranging first guide parts and second guide parts at identical positions in the planar direction. In this way, the insertion direction where the electronic substrate is inserted into the insertion openings is not limited to the planar direction. According to the present aspect therefore, the electronic apparatus that allows the electronic substrate to be inserted from various directions can be provided.

BRIEF DESCRIPTION OF DRAWINGS

The above and other objects, features and advantages of the present disclosure will become more apparent from the following detailed description made with reference to the accompanying drawings. In the drawings.

EMBODIMENT FOR CARRYING OUT INVENTION

An embodiment is explained hereunder in reference to drawings. In the embodiment, when only a part of a configuration is explained, the preceding explanation can apply to another part of the configuration. Further, not only configurations specified in the explanations of the embodiments can be combined but also the configurations can be combined partially even when they are not specified as long as the combinations are not particularly disadvantageous.

The embodiment is explained hereunder in reference to drawings.

Figure 1:
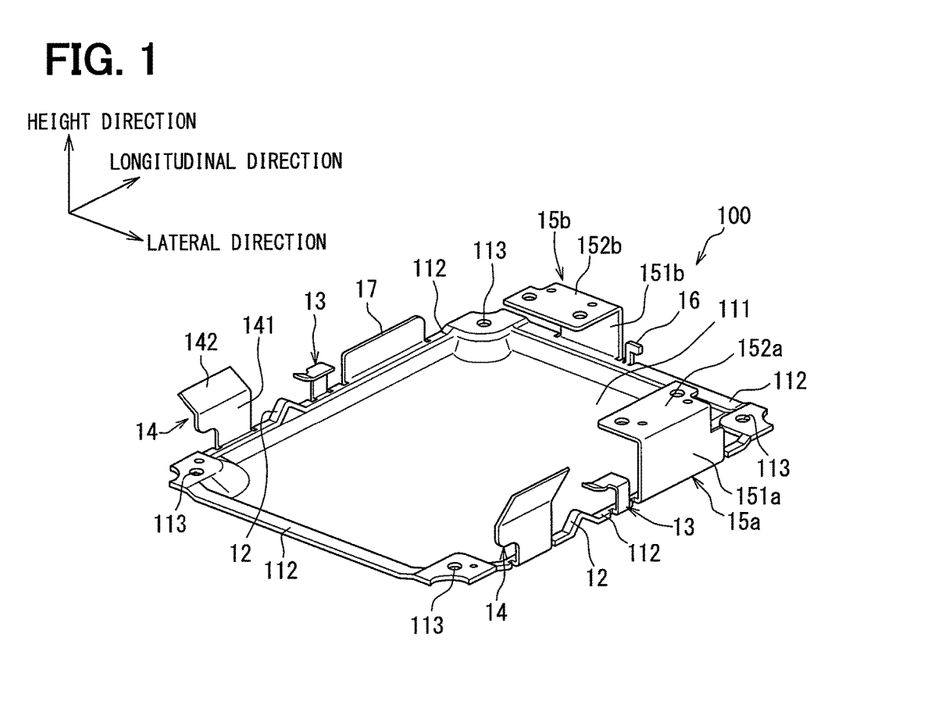
FIG. 1 is a perspective view of a cover according to an embodiment.

An electronic apparatus 10 according to the present embodiment includes a metal cover 100, an electronic substrate 200, a metal case 300, and others. As shown in FIG. 1, the cover 100 includes a flat plate part 11, a pair of first guide parts 12, a pair of first upright wall parts 13, a pair of third guide parts 14, two antenna seat parts 15, a regulation part 16, and a locking wall 17. The width of the cover 100 in a lateral direction is set so as to be slightly larger than the width of the electronic substrate 200 in the lateral direction. Here, a longitudinal direction and a lateral direction in FIG. 1 are directions on a planar plane of the cover 100. Further, a height direction is a normal direction of the cover 100.

The flat plate part 11 is nearly tabular and has a predetermined thickness in the height direction. The flat plate part 11 is nearly square when viewed from the height direction. The flat plate part 11 is made of a metal. The flat plate part 11 includes a bottom surface part 111 and a raised edge part 112. The bottom surface part 111 is arranged more inside than the raised edge part 112 in the cover 100. The bottom surface part 111 retracts from the raised edge part 112 toward the direction opposite to the height direction by a predetermined length. The predetermined length is set at such a length as to be able to prevent a rear-surface electronic component 201a mounted over the rear surface 201 of the electronic substrate 200 facing the bottom surface part 111 from being in contact with the bottom surface part 111 in the state of assembling the electronic substrate 200 into the cover 100. Cover fastening holes 113 are formed at the four corners of the raised edge part 112. Fastening members passing through the cover fastening holes 113 retain the cover 100, the electronic substrate 200, and the case 300. The inner diameters of the cover fastening holes 113 are nearly identical to the inner diameters of substrate fastening holes 202 formed in the electronic substrate 200 (refer to FIG. 4). The raised edge part 112 is formed continuously from the bottom surface part 111 in the manner of surrounding the bottom surface part 111 and is raised from the bottom surface part 111 in the height direction.

Figure 2:
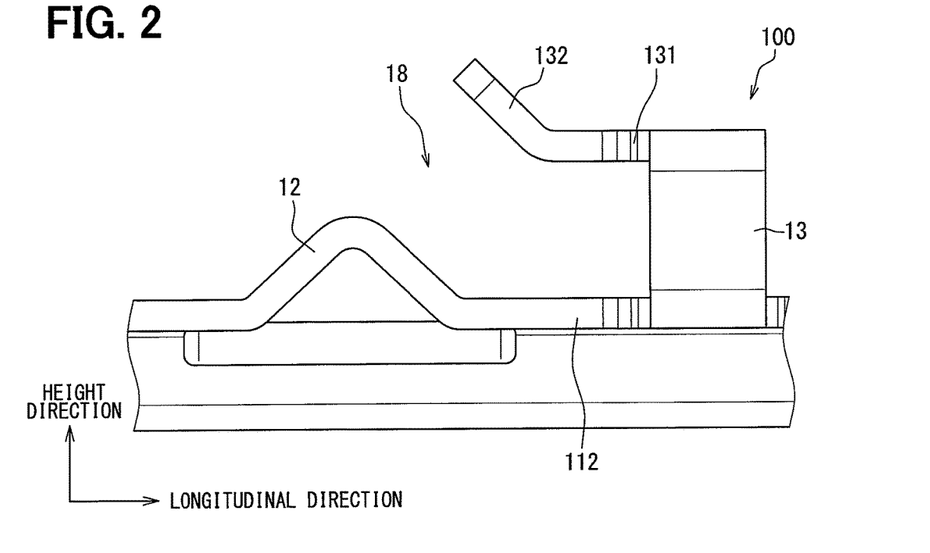
FIG. 2 is an enlarged view of a part including a first guide part and a second guide part according to the embodiment.

The paired first guide parts 12 are formed at both the ends in the lateral direction of the raised edge part 112 one by one. The first guide parts 12 protrude from the raised edge part 112 in the height direction. Specifically, as shown in FIG. 2, the first guide part 12 is formed protrusively in the shape of a mountain in the height direction. The first guide part 12 rises smoothly from the raised edge part 112. The paired first guide parts 12 extend in a posture of inclining from the flat plate part 11. The paired first guide parts 12 are formed at positions identical to each other in the longitudinal direction.

The paired first upright wall parts 13 are arranged at positions apart from the paired first guide parts 12 in the longitudinal direction and are formed at both the ends in the lateral direction of the raised edge part 112. The paired first upright wall parts 13 are arranged at positions identical to each other when viewed from the lateral direction. The paired first upright wall parts 13 are formed upright from the raised edge part 112 in the height direction and continue from the raised edge part 112. The height of each of the first upright wall parts 13 is higher than the height of each of the first guide parts 12 in the height direction (refer to FIG. 6). The paired first upright wall parts 13 are arranged outside a projected space obtained when the bottom surface part 111 is projected in the height direction.

Bent parts 131 and second guide parts 132 are formed continuously from the first upright wall parts 13. The bent parts 131 and the second guide parts 132 are formed by bending tabular parts extending from the first upright wall parts 13. The bent parts 131 are formed continuously from the ends located in the height direction of the first upright wall parts 13 toward the direction opposite to the longitudinal direction. Each of the bent parts 131 has a predetermined length in the direction opposite to the longitudinal direction.

The second guide parts 132 are formed further continuously from the bent parts 131. The second guide parts 132 extend from the ends in the direction opposite to the longitudinal direction of the bent parts 131 in a posture of inclining toward the height direction. The second guide parts 132 extend toward the direction opposite to the extending direction of the first guide parts 12 in the longitudinal direction. The connection parts of the second guide parts 132 and the bent parts 131 are formed smoothly. The second guide parts 132 are arranged at positions apart from the first guide parts 12 in the longitudinal direction. Specifically, the positions of the tip parts of the second guide parts 132 extending in the direction opposite to the longitudinal direction and the positions of the ends in the longitudinal direction of the first guide parts 12 are aligned in the longitudinal direction. The second guide parts 132 are located more apart than the first guide parts 12 from the flat plate part 11. The second guide parts 132 and the first guide parts 12 are arranged in the manner of being displaced from each other in the longitudinal direction. The second guide parts 132 are located on the rear side of the first guide parts 12. Insertion openings 18 that are gaps through which the electronic substrate 200 can be inserted are formed between the first guide parts 12 and the second guide parts 132.

The paired third guide parts 14 are arranged at positions apart from the paired first guide parts 12 in the direction opposite to the longitudinal direction and formed at both the ends in the lateral direction of the raised edge part 112 one by one. Each of the paired third guide parts 14 includes an upright part 141 and an inclined part 142. The upright parts 141 are formed continuously from the raised edge part 112 and constitute walls extending in the height direction respectively. The heights in the height direction of the upright parts 141 are larger than the heights in the height direction of the first upright wall parts 13 (refer to FIG. 6). The distance between the upright parts 141 of the paired third guide parts 14 is set so as to be slightly larger than the width in the lateral direction of the electronic substrate 200. By such setting, the upright parts 141 can restrict the movement in the lateral direction of the electronic substrate 200.

The inclined parts 142 included in the paired third guide parts 14 respectively are formed continuously from the upright parts 141. The distance between the paired inclined parts 142 is set so as to increase toward the height direction. That is, the inclined parts 142 are formed so as to protrude outside the cover 100 toward the height direction. In the lateral direction, the outer peripheries of the inclined parts 142 protrude more outside than the outer periphery of the raised edge part 112 in the cover.

A first antenna seat part 15a and a second antenna seat part 15b are disposed as the antenna seat parts 15 in the cover 100. The first antenna seat part 15a and the second antenna seat part 15b continue from the raised edge part 112. The first antenna seat part 15a and the second antenna seat part 15b are arranged at positions apart from the second guide parts 132 in the longitudinal direction respectively. The first antenna seat part 15a and the second antenna seat part 15b include second upright wall parts 151 and antenna installation parts 152 respectively.

The first antenna seat part 15a continues from the raised edge part 112 located in the lateral direction at the bottom surface part 111 and is arranged at a position apart from the first upright wall parts 13 in the longitudinal direction. A second upright wall part 151a of the first antenna seat part 15a is a wall protruding from the raised edge part 112 in the height direction. The height in the height direction of the second upright wall part 151 is larger than the heights in the height direction of the upright parts 141 (refer to FIG. 6). An antenna installation part 152a of the first antenna seat part 15a is formed continuously from the end in the height direction of the second upright wall part 151. The antenna installation part 152a is a part extending inside the cover from the second upright wall part 151a and has a predetermined length in the lateral direction. Over the top surface located in the height direction of the antenna installation part 152a, an antenna for communication between the electronic apparatus 10 and another component is arranged.

The second antenna seat part 15b continues from the raised edge part 112 located in the longitudinal direction at the bottom surface part 111. An antenna installation part 152b of the second antenna seat part 15b is a part extending inside the cover from the second upright wall part 151b and has a predetermined length in the longitudinal direction. Over the top surface located in the height direction of the antenna installation part 152b, an antenna is arranged similarly to the antenna installation part 152a.

The locking wall 17 is arranged at the raised edge part 112 on the side opposite to the side where the first antenna seat part 15a is formed in the raised edge part 112 located on both the sides with the bottom surface part 111 interposed in between in the lateral direction. The locking wall 17 locks the electronic substrate 200. The distance in the lateral direction between the locking wall 17 and the first antenna seat part 15a is set at an extent of slightly larger than the width in the lateral direction of the electronic substrate 200. The movement in the lateral direction of the electronic substrate 200 is restricted by the locking wall 17 and the second upright wall part 151a of the first antenna seat part 15a. That is, when the electronic substrate 200 is divided into a rear portion and a front portion in the longitudinal direction, the movement in the lateral direction of the rear portion where the first antenna seat part 15a is formed is restricted by the locking wall 17 and the second upright wall part 151a of the first antenna seat part 15a. In contrast, the movement in the lateral direction of the front portion is restricted by the paired upright parts 141.

The regulation part 16 has the function of restricting the movement in the height direction of the electronic substrate 200. The regulation part 16 is formed continuously from the end 11a in the longitudinal direction of the flat plate part 11, specifically the raised edge part 112 located at the end in the longitudinal direction of the bottom surface part 111. The regulation part 16 is adjacent to the second antenna seat part 15b in the lateral direction. The regulation part 16 is formed at a position apart from the second upright wall part 151b of the second antenna seat part 15b in the direction opposite to the longitudinal direction. The regulation part 16 has a regulation wall part 161 and a locking part 162. The regulation wall part 161 extends from the end 11a in the height direction. The locking part 162 is formed continuously from the regulation wall part 161 and bends from the regulation wall part 161 in the lateral direction. When the electronic substrate 200 intends to move in the height direction in the state of assembling the electronic substrate 200 into the cover 100, the locking part 162 comes into contact with the electronic substrate 200 and restricts further movement of the electronic substrate 200.

Figure 6:
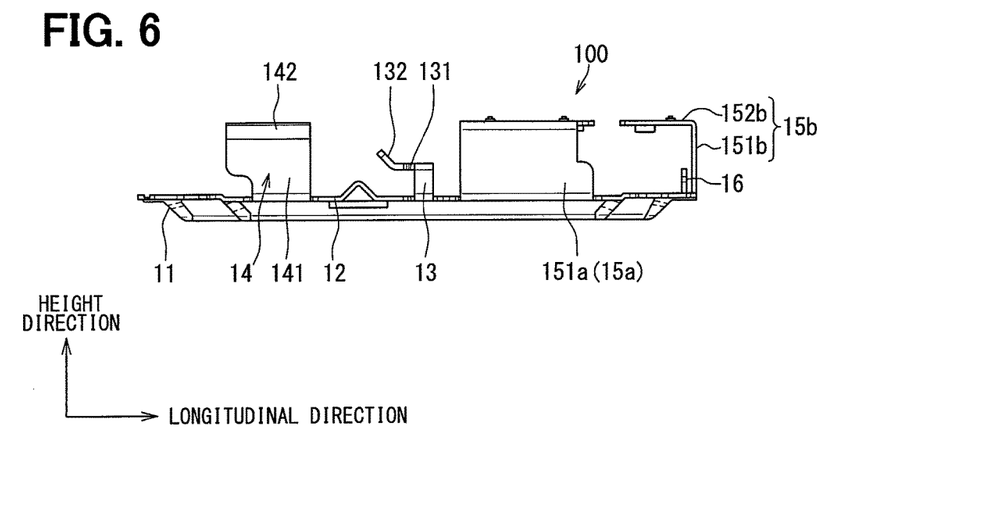
FIG. 6 is a side view of the cover viewed from a lateral direction according to the embodiment.

In the cover 100 explained heretofore, as shown in FIG. 6, the third guide parts 14, the first guide parts 12, the second guide parts 132, the first antenna seat part 15a, and the regulation part 16 are arranged in this order toward the longitudinal direction.

Figure 3:
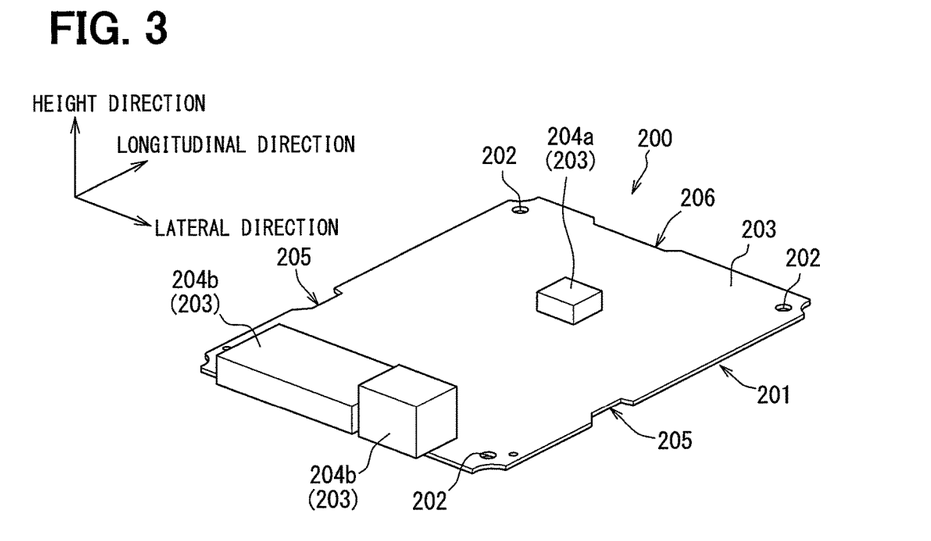
FIG. 3 is a perspective view of an electronic substrate according to the embodiment.

The configuration of the electronic substrate 200 is explained hereunder in reference to FIG. 3. The electronic substrate 200 is a substrate having a thickness in the height direction and is nearly square. The external shape of the electronic substrate 200 is slightly smaller than the external shape of the cover 100. A surface facing the flat plate part 11 in the state of being retained in the cover 100 in both the surfaces of the electronic substrate 200 is the rear surface 201 of the electronic substrate 200 and the other surface facing in the height direction is a front surface 203. Electronic components 204 are mounted over both the front surface 203 and the rear surface 201 of the electronic substrate 200. Substrate fastening holes 202 through which fastening members integrally retaining the cover 100, the electronic substrate 200, and the case 300 pass are formed at the four corners of the electronic substrate 200. The substrate fastening holes 202 pass through the electronic substrate 200 in the height direction. The substrate fastening holes 202 and cover fastening holes 113 are formed so as to be concentrically located in the state of assembling the electronic substrate 200 into the cover 100 (refer to FIG. 4).

A small electronic component 204a and large electronic components 204b are mounted as the electronic components 204 over the electronic substrate 200. The height of the small electronic component 204a from a mounting surface in the height direction is relatively small. The heights of the large electronic components 204b are larger than the height of the small electronic component 204a. The large electronic components 204b are arranged concentratedly at positions apart from the small electronic component 204a in the direction opposite to the longitudinal direction. Further, a largest electronic component 204c having the largest physical construction in the large electronic components 204b is arranged at a position apart from the first guide parts 12 in the direction opposite to the longitudinal direction.

Meanwhile, the term "concentratedly" cited here represents the situation of arranging large electronic components 204b more on the front side than the rear side of the electronic substrate 200. Further, an electric component 204 smaller than the heights of the second upright wall parts 151 in the height direction is defined as a small electronic component 204a.

Figure 9:
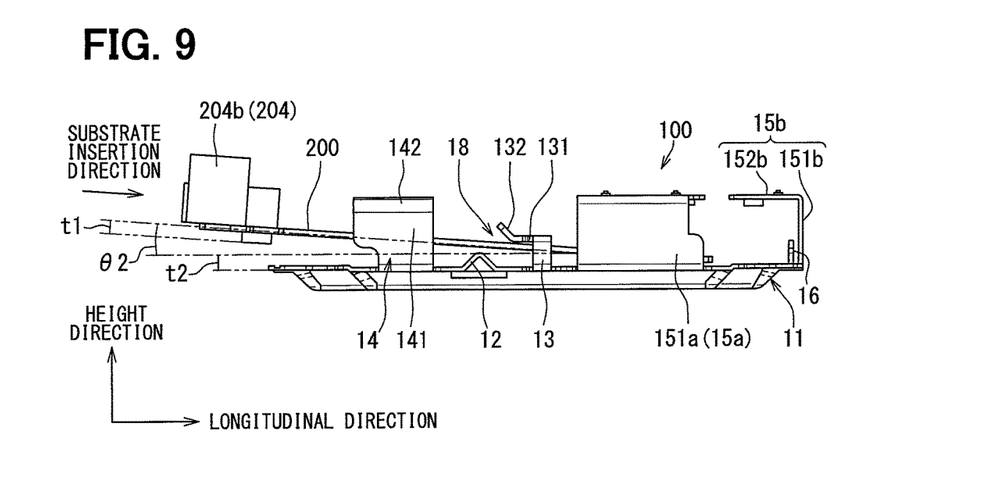
FIG. 9 is an explanatory diagram of an angle adjustment process according to the embodiment.

The heights t2 of the first guide parts 12 in the height direction are set so as to be larger than the height t1 of a rear-surface electronic component 201a having the largest height in the height direction in the rear-surface electronic components 201a mounted over the rear surface 201 among the electronic components 204 (refer to FIG. 9). The rear-surface electronic component 201a fits into a space formed by the raised edge part 112 and the bottom surface part 111 in the state of assembling the electronic substrate 200 into the cover 100. Namely, the bottom surface part 111 plays the role of forming a space for containing the rear-surface electronic component 201a.

Figure 4:
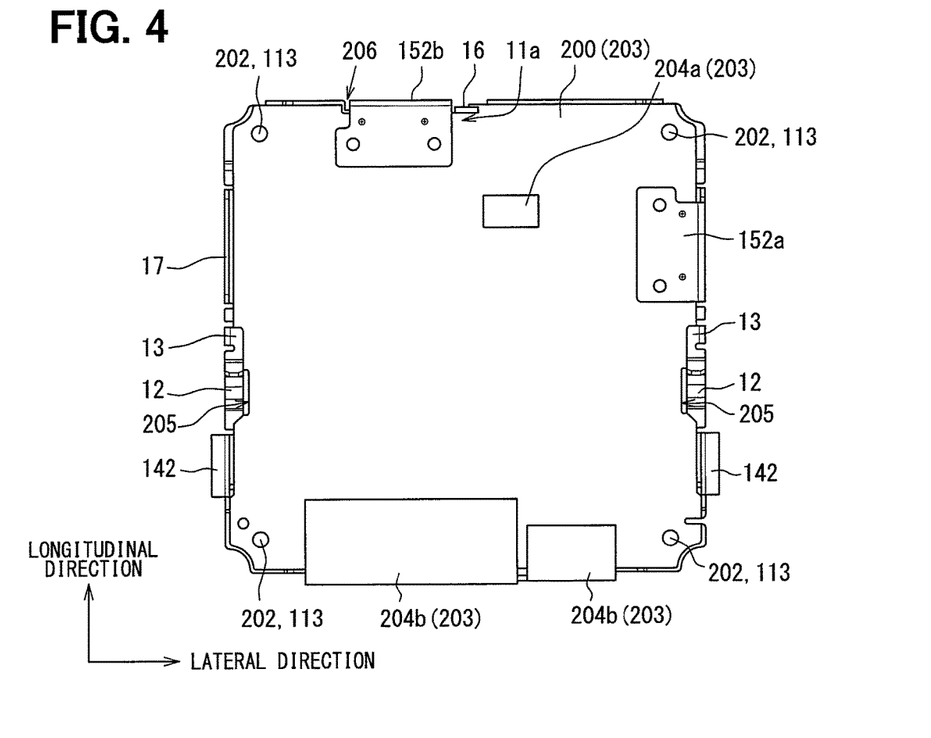
FIG. 4 is a top view in the state of assembling the electronic substrate into the cover according to the embodiment.

As shown in FIG. 3, penetrating parts 205 notched on the inner sides of the electronic substrate 200 are formed at both the ends in the lateral direction of the electronic substrate 200. The penetrating parts 205 are formed so as to penetrate the electronic substrate 200 in the height direction and open at side faces in the lateral direction. The penetrating parts 205 are formed at positions identical to each other in the longitudinal direction. As shown in FIG. 4, the first guide parts 12 are arranged at the penetrating parts 205 respectively in the state of assembling the electronic substrate 200 into the cover 100. The widths in the lateral direction of the notched parts of the penetrating parts 205 are slightly larger than the widths in the lateral direction of the first guide parts 12.

A notched groove 206 is formed at the end in the longitudinal direction of the electronic substrate 200. The notched groove 206 is formed so as to penetrate the electronic substrate 200 in the height direction and notched on the inner side of the electronic substrate 200. The second upright wall part 151b of the second antenna seat part 15b and the regulation part 16 are arranged at the notched groove 206 in the state of assembling the electronic substrate 200 into the cover 100 (refer to FIG. 4 and FIG. 7). An end 206a of the electronic substrate 200 facing the notched groove 206 in the lateral direction is located at a position apart in the direction opposite to the lateral direction from the tip part of the locking part 162 extending in the lateral direction in the state of assembling the electronic substrate 200 into the cover 100. That is, the tip part of the locking part 162 is located at the end of the electronic substrate 200 in the height direction (refer to FIG. 7).

Figure 5:
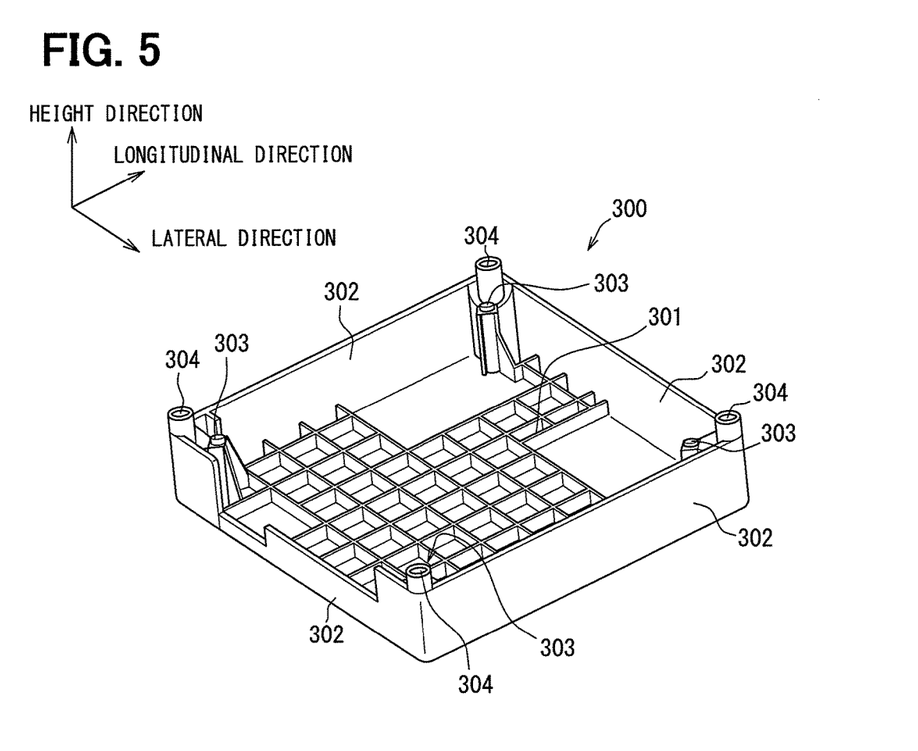
FIG. 5 is a perspective view of a case according to the embodiment.

The case 300 is a nearly rectangular chassis and includes a case bottom plate 301 and four case sidewalls 302. The case 300 is surrounded by the four case sidewalls 302 and forms an opening opening in the height direction (refer to FIG. 5). Insertion holes 304 into which fixing members to fix the case 300 to another component are inserted are formed at the four corners of the case 300. Four case fastening holes 303 are formed at parts closer to the inner side of the case 300 than the insertion holes 304. The interior of each of the case fastening holes 303 is worked into such a shape as to be fitted to a fastening member and plays the role of a nut. Nearly grid-like ribs protruding in the height direction are formed at the case bottom plate 301. A notched part opening in the height direction is formed at the case sidewall 302 located in the direction opposite to the longitudinal direction. Some of the electronic components 204 arranged at the end in the direction opposite to the longitudinal direction of the electronic substrate 200 are arranged at the notched part.

Figure 8:
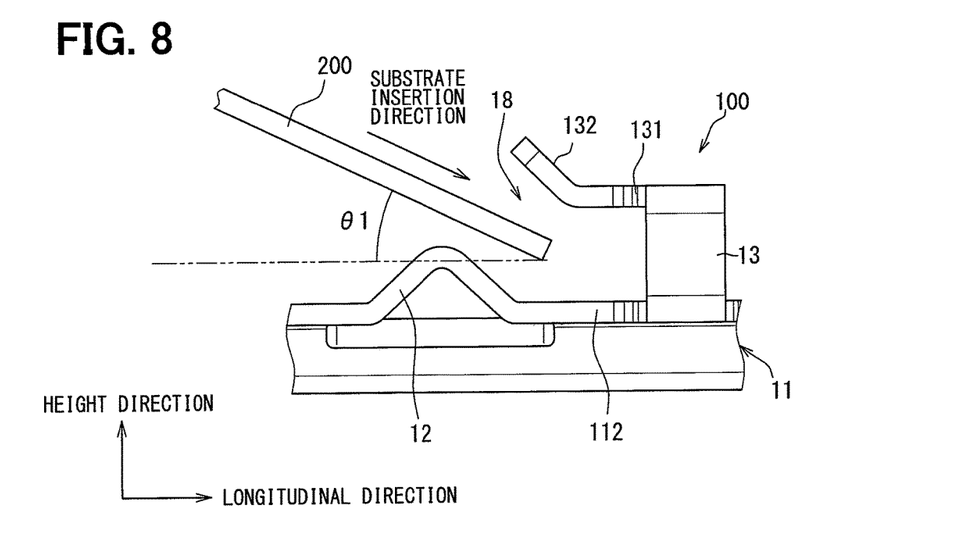
FIG. 8 is an explanatory diagram of a substrate insertion process according to the embodiment.

A manufacturing process of the electronic apparatus 10 is explained. Firstly as shown in FIG. 8, the electronic substrate 200 is inserted between the first guide parts 12 and the second guide parts 132 toward the longitudinal direction in the state of inclining the plate surface direction at a predetermined angle θ1 to the cover 100 (substrate insertion process S1). In the present embodiment, the longitudinal direction is nearly identical to the insertion direction of inserting the electronic substrate 200. Here, the predetermined angle is set as an insertion angle at which the electronic substrate 200 is in contact with neither the first guide parts 12 nor the second guide parts 132. The electronic substrate 200 is inserted while the end in the direction opposite to the longitudinal direction is gripped by a machine or the like. Here, the insertion method is not limited to grip by a machine or the like but for example the electronic substrate 200 may be pushed in the longitudinal direction.

At the substrate insertion process S1, when the electronic substrate 200 inclines to the extent that an angle between the electronic substrate 200 and the cover 100 is a predetermined value or more, the electronic substrate 200 approaches the flat plate part 11 from the upper side in the height direction. On this occasion, the electronic substrate 200 is arranged between the third guide parts 14 disposed on both the sides of a virtual axis line along the insertion direction of the electronic substrate 200 while being guided by the two inclined parts 142. As a result, to accurately position the electronic substrate 200 between the upright parts 141 at the start of the substrate insertion process S1 is not required. The electronic substrate 200 therefore can be inserted easily even from the upper side in the height direction. Then after the substrate insertion process S1, electronic components such as an antenna are arranged at the antenna seat parts 15.

Figure 7:
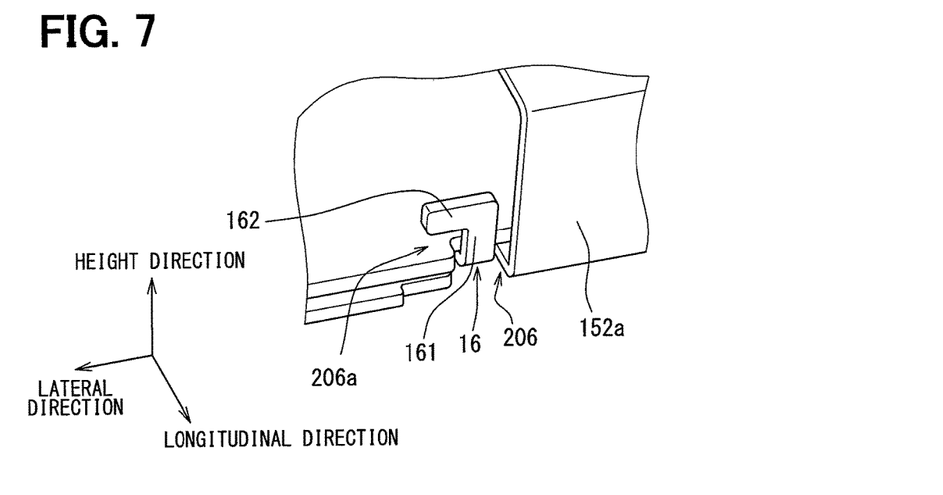
FIG. 7 is an enlarged view of a regulation part according to the embodiment.

Successively as shown in FIG. 9, the angle of the electronic substrate 200 to the cover 100 is adjusted at an angle θ2 that is smaller than θ1 in the middle of sliding the electronic substrate 200 in the longitudinal direction (angle adjustment process S2). On this occasion, the electronic substrate 200 is arranged so as to be supported by the ends in the height direction of the first guide parts 12. As a result, the electronic substrate 200 pivots easily on the ends in the height direction of the first guide parts 12 and hence the angle adjustment is facilitated. Then as shown in FIG. 4 and FIG. 7, the series of the insertion processes finish in the state of completely inserting the electronic substrate 200 until the notched groove 206 of the electronic substrate 200 abuts on the regulation part 16.

Figure 10:
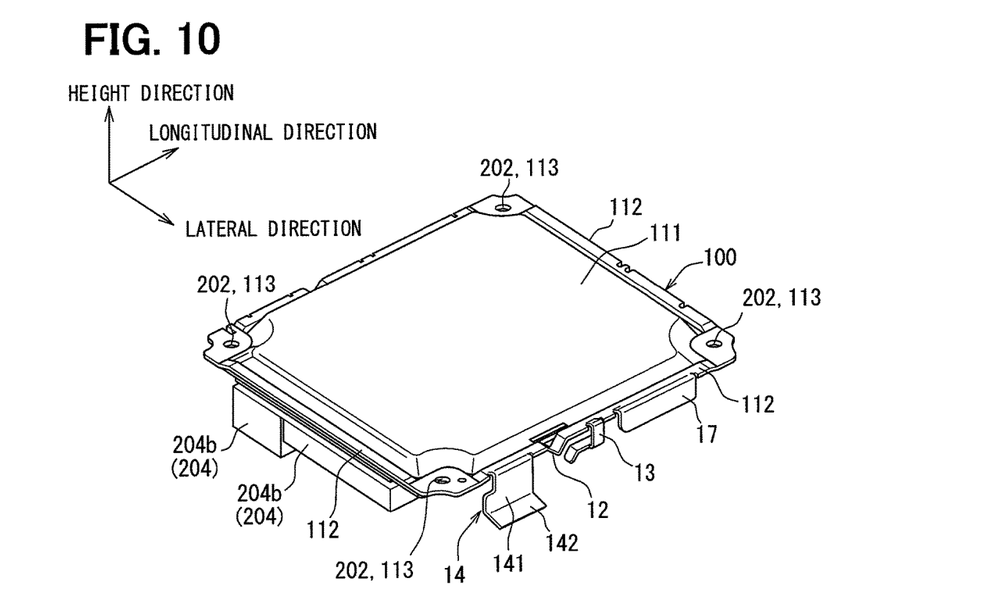
FIG. 10 is an explanatory diagram of a substrate inversion process according to the embodiment.

Successively, at the substrate insertion process S1, the end on the front side of the electronic substrate 200 and the cover 100 are integrally gripped again and the electronic substrate 200 and the cover 100 are integrally reversed as shown in FIG. 10 (substrate reversal process S3). On this occasion, the movement in the height direction of the rear side of the electronic substrate 200 is restricted by the regulation part 16. Meanwhile, the movement in the height direction of the front side of the electronic substrate 200 is restricted by being gripped by a machine or the like.

Figure 11:
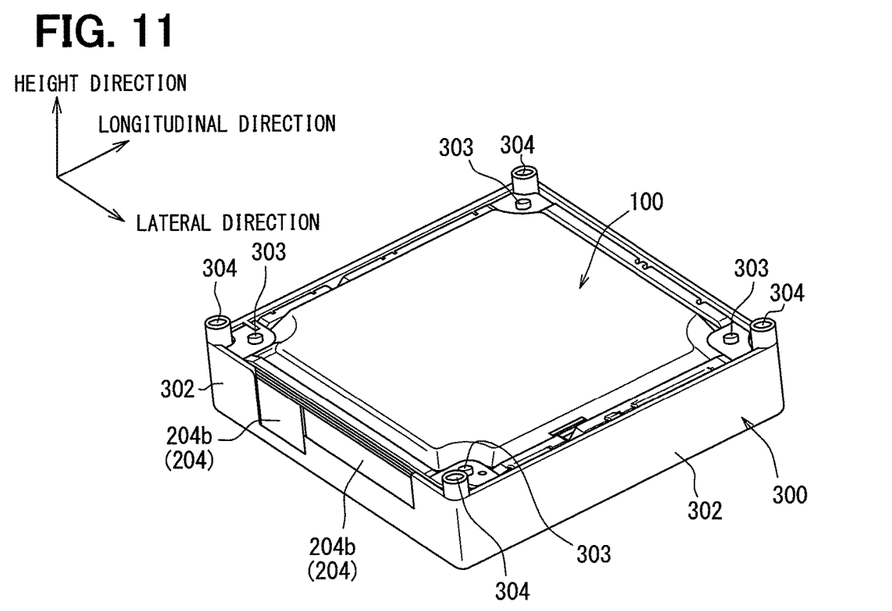
FIG. 11 is an explanatory diagram of a case reception process according to the embodiment.

Then the electronic substrate 200 and the cover 100, those being in the reversed state, are received in the case 300 (case reception process S4). On this occasion: fastening members are inserted into respective fastening holes in the state of arranging the positions of the substrate fastening holes 202, the cover fastening holes 113, and the case fastening holes 303 concentrically in the height direction; the electronic substrate 200, the cover 100, and the case 300 are integrated; and thus the manufacturing of the electronic apparatus 10 is completed (refer to FIG. 11).

Effects obtained in the present embodiment are explained hereunder.

(1) The first guide parts 12 and the second guide parts 132 are formed obliquely to the flat plate part 11 and are arranged in the order of the first guide parts 12 and then the second guide parts 132 in the longitudinal direction. Consequently, the first guide parts 12 and the second guide parts 132 play the role of guides when the electronic substrate 200 is retained in the cover 100 at an angle parallel to the longitudinal direction for example. As a result, the electronic substrate 200 is inserted smoothly into the insertion openings 18 between the first guide parts 12 and the second guide parts 132. Further, the first guide parts 12 and the second guide parts 132 forming the insertion openings 18 into which the electronic substrate 200 can be inserted are arranged in the manner of being displaced from each other in the longitudinal direction. As a result, the frontages of the insertion openings 18 are wider in comparison with the case of arranging the first guide parts 12 and the second guide parts 132 at identical positions in the longitudinal direction. In this way, an insertion direction where the electronic substrate 200 is inserted into the insertion openings 18 is not limited to an angle parallel to the longitudinal direction. According to the present embodiment therefore, the electronic apparatus 10 that allows the electronic substrate 200 to be inserted from various directions can be provided.

(2) When the electronic substrate 200 is retained in the cover 100 by inserting the electronic substrate 200 between the first guide parts 12 and the second guide parts 132, since the penetrating parts 205 are formed in the electronic substrate 200, the electronic substrate 200 is hardly destabilized. Specifically, the first guide parts 12 can be arranged at the penetrating parts 205 in the state of retaining the electronic substrate 200 in the cover 100 and hence the electronic substrate 200 is supported by the tips of the first guide parts 12 and never takes the state of being off the flat plate part 11. As a result, the electronic substrate 200 can be retained in the cover 100 stably.

(3) The heights of the first guide parts 12 in the height direction are set so as to be larger than the height of a rear-surface electronic component 201a having the largest height in the height direction in the rear-surface electronic components 201a mounted over the rear surface 201 among the electronic components 204. As a result, during the manufacturing of the electronic apparatus 10, when the electronic substrate 200 is inserted slidably, the rear-surface electronic component 201a is not concerned to come into contact with the flat plate part 11 of the cover 100. Further, the bottom surface part 111 retracts from the raised edge part 112 by a predetermined length so that the rear-surface electronic component 201a mounted over the rear surface 201 may not be in contact with the bottom surface part 111. As a result, the rear-surface electronic component 201a is not concerned to come into contact with the cover 100 in the state of assembling the electronic substrate 200 into the cover 100 (the state in FIG. 4).

(4) When the electronic substrate 200 inclines to the extent that an angle between the electronic substrate 200 and the cover 100 is a predetermined value or more, the electronic substrate 200 approaches the flat plate part 11 from the upper side. As in the present embodiment, the inclined parts 142 the distance between which expands as they get away from the flat plate part 11 can guide the electronic substrate 200 approaching the flat plate part 11 from the upper side. As a result, the improvement of assembling performance can be expected.

(5) The regulation part 16 is formed continuously from the end 11a in the longitudinal direction of the cover 100, specifically the raised edge part 112. As a result, the movement in the height direction of the rear side of the electronic substrate 200 is restricted by the regulation part 16 and the movement in the height direction of the front side of the electronic substrate 200 is restricted by being gripped by a machine or the like.

(6) An antenna to send and receive radio waves is likely to be upsized in comparison with an ordinary electronic component. Accordingly, the first antenna seat part 15a over which an antenna is arranged is also likely to be upsized. As a result, interference between the electronic component 204 mounted over the electronic substrate 200 and the first antenna seat part 15a is concerned. In the present embodiment however, the second guide parts 132 and the first antenna seat part 15a are arranged in this order in the longitudinal direction. Since the first guide parts 12 and the second guide parts 132 guide the electronic substrate 200 before the electronic substrate 200 and the first antenna seat part 15a approach each other therefore, interference between the first antenna seat part 15a and the electronic component 204 is prevented. As a result, attention is not required to be paid on the fear that the electronic component 204 mounted over the electronic substrate 200 interferes with the first antenna seat part 15a when the electronic substrate 200 is inserted and hence manufacturing efficiency improves.

(7) A largest electronic component 204c having a largest physical construction among the large electronic components 204b is arranged at a position apart from the first guide parts 12 in the direction opposite to the longitudinal direction. That is, the first guide parts 12 and the largest electronic component 204c are arranged in this order in the longitudinal direction. Then the insertion direction where the electronic substrate 200 is inserted is nearly identical to the longitudinal direction. Meanwhile, in the electronic substrate 200, the largest electronic component 204c that is likely to interfere with the cover in comparison with the small electronic component 204a is arranged at a position apart from the first guide parts 12 and the second guide parts 132 in the direction opposite to the insertion direction. As a result, during the process of inserting the electronic substrate 200 into the insertion openings 18, the largest electronic component 204c does not go to the side of the first antenna seat part 15a beyond the first guide parts 12 and the second guide parts 132. Interference between the largest electronic component 204c and the first antenna seat part 15a is therefore restrained without fail. Consequently, attention is not required to be paid on interference between the largest electronic component 204c and the cover 100 when the electronic substrate 200 is inserted into the insertion openings 18 and hence manufacturing efficiency improves.

(8) The bent parts 131 having predetermined lengths in the longitudinal direction are formed between the first upright wall parts 13 and the second guide parts 132. As a result, the first upright wall parts 13 are kept away from the second guide parts 132 in the longitudinal direction. As a result, collision of the electronic substrate 200 against the first upright wall parts 13 is restrained when the tip of the electronic substrate 200 is inserted into the insertion openings 18.

An embodiment has heretofore been explained but the present disclosure is not interpreted by being limited to the present embodiment and can be applied to various examples and combinations within the range not deviating from the gist of the present disclosure. Modified examples of the above embodiment are described hereunder.

The cover 100 may not have the third guide parts 14 or the regulation part 16 may not be formed. Further, the antenna seat parts 15 may not be formed. Moreover, the penetrating parts 205 may not be formed.

Figure 12:
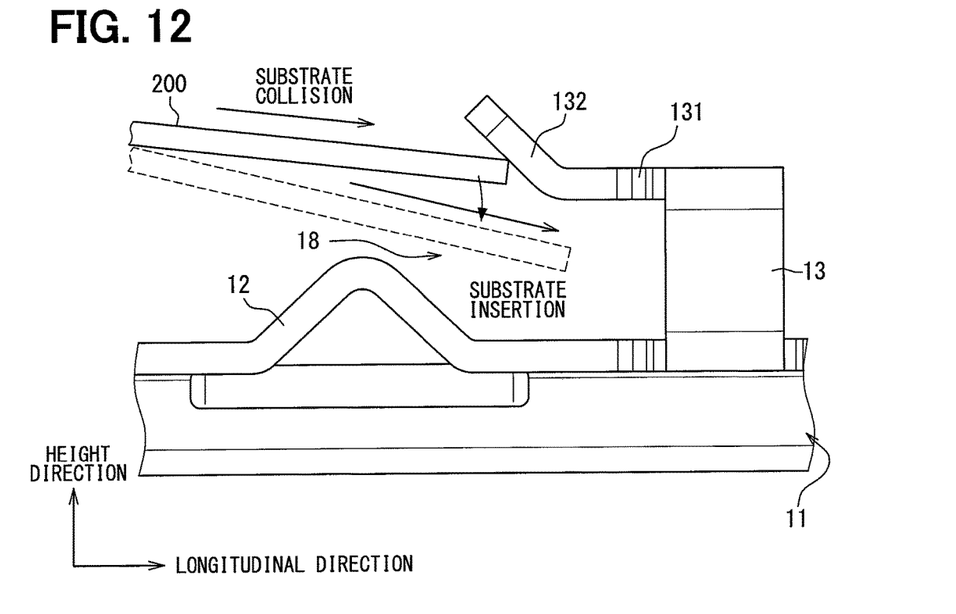
FIG. 12 is a view showing insertion angles and positions of an electronic substrate according to a modified example.
Figure 13:
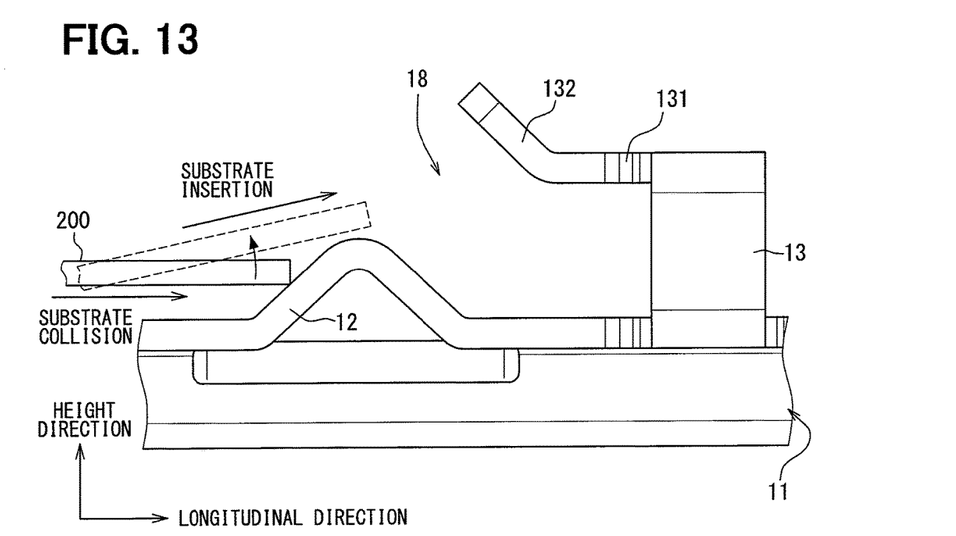
FIG. 13 is a view showing insertion angles and positions of an electronic substrate according to a modified example.

In the above embodiment, at the substrate insertion process S1, the electronic substrate 200 is inserted at such an angle as to be inserted between the first guide parts 12 and the second guide parts 132 at an insertable angle. As shown in FIG. 12 however, the electronic substrate 200 may be inserted at such an angle and a position as to hit the second guide parts 132. On this occasion, the tip of the electronic substrate 200 collides with the second guide parts 132 and then is introduced into the insertion openings 18 between the first guide parts 12 and the second guide parts 132 by the inclination of the second guide parts 132. The electronic substrate 200 therefore can be inserted smoothly. Further, as shown in FIG. 13, the electronic substrate 200 may be inserted at such an angle and a position as to hit the first guide parts 12. Also on this occasion, the electronic substrate 200 is introduced to the upper side in the height direction and inserted into the insertion openings 18 by the inclination of the first guide parts 12.

Figure 14:
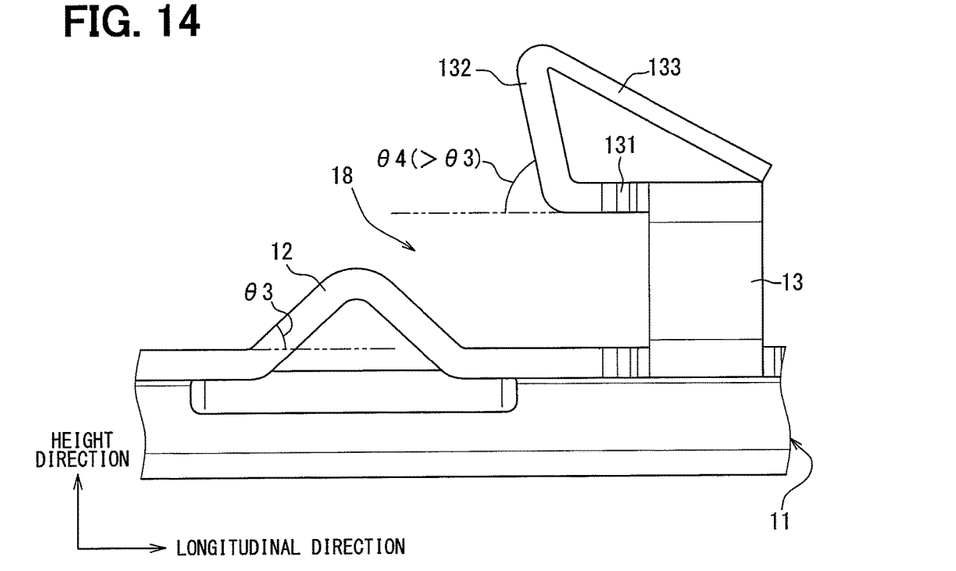
FIG. 14 is an enlarged view of a part including a first guide part and a second guide part according to a modified example.

Respective inclination angles θ3 and θ4 of the second guide parts 132 and the first guide parts 12 to the flat plate part 11 may be an identical angle or either of the inclination angles may be set so as to be larger than the other inclination angle. For example as shown in FIG. 14, the inclination angle θ4 of the second guide parts 132 is set so as to be larger than the inclination angle θ3 of the first guide parts 12. As a result, when the electronic substrate 200 is inserted into the insertion openings 18 in the manner of hitting the second guide parts 132 and being induced, the range where the electronic substrate 200 hits the second guide parts 132 expands in comparison with the case where both the inclination angles are identical. As a result, the degrees of freedom of the angle and the position at which the electronic substrate 200 is inserted expand further. Moreover, in such a case, if the inclination angle of the second guide parts 132 is steep, the second guide parts 132 may undesirably be folded by a pressure force given in the longitudinal direction when the electronic substrate 200 collides with the second guide parts 132. In such a case, as shown in FIG. 14, a beam part 133 connecting the first upright wall part 13 to the tip of the second guide part 132 in the height direction may be formed. By so doing, a collision force in the longitudinal direction added to the second guide part 132 can be dispersed and the second guide parts 132 are restrained from being folded.

Figure 15:
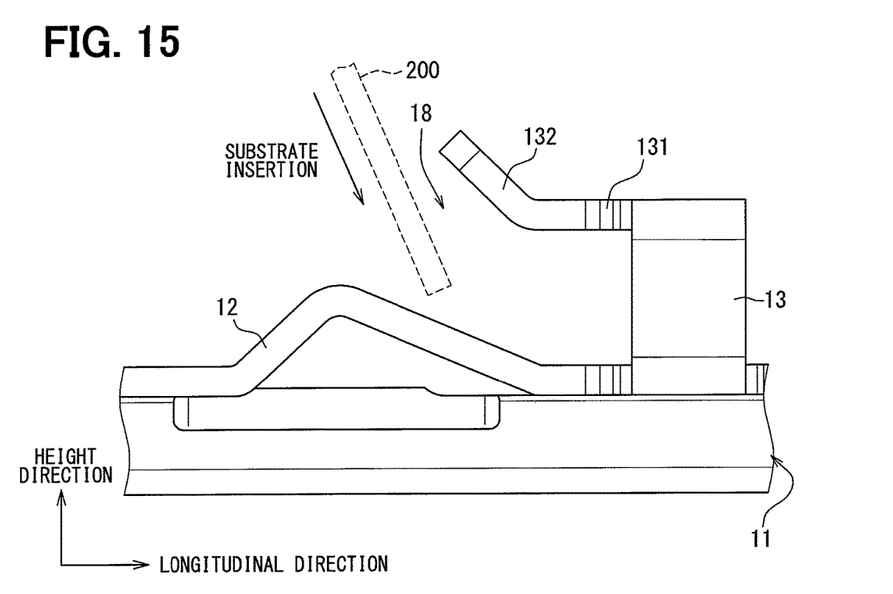
FIG. 15 is an enlarged view of a part including a first guide part and a second guide part according to a modified example.

Although the first guide parts 12 and the second guide parts 132 do not overlap each other in the height direction in the above embodiment, the ends on the rear side of the inclined planes of the first guide parts 12 may overlap the second guide parts 132 in the height direction as shown in FIG. 15. By so doing, at the substrate insertion process S1, even when the electronic substrate 200 is inserted into the insertion openings 18 at such an angle as not to come into contact with both the first guide parts 12 and the second guide parts 132, the electronic substrate 200 can be inserted smoothly by the inclined planes on the rear side of the first guide parts 12.

In the above embodiment, the upright parts 141 are walls that are formed continuously from the raised edge part 112 and extend in the height direction. The upright parts 141 however may be formed into a shape of increasing the distance between the upright parts 141 toward the direction opposite to the longitudinal direction. By so doing, even when the electronic substrate 200 is inserted without inclining from the flat plate part 11, the insertion can be guided by the upright parts 141.

The second upright wall parts 151 and the locking wall 17 may be formed so that the distance between the second upright wall parts 151 and the locking wall 17 may expand toward the direction opposite to the longitudinal direction. On this occasion, the insertion of the electronic substrate 200 in the longitudinal direction can be guided by the second upright wall parts 151 and the locking wall 17.

Figure 16:
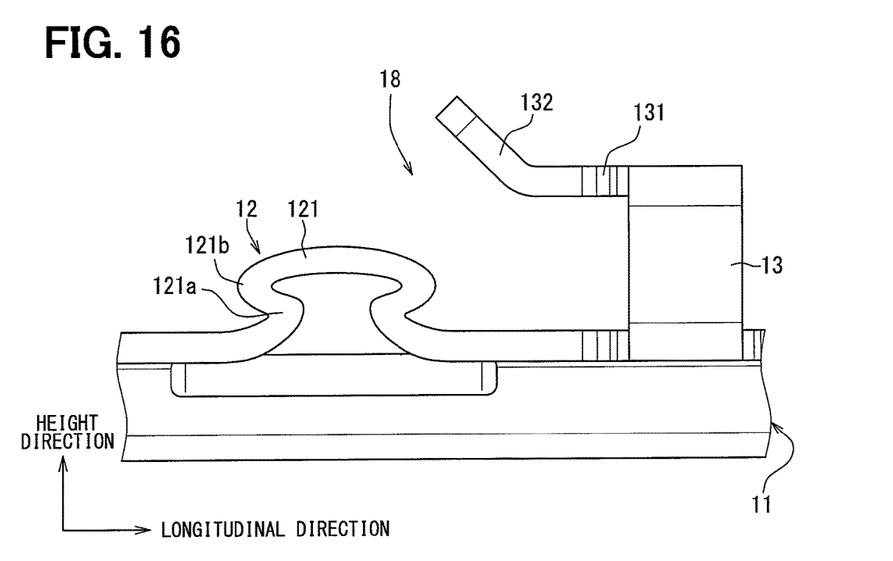
FIG. 16 is an enlarged view of a part including a first guide part and a second guide part according to a modified example.

A first bellows part 121 may be formed in the first guide part 12 as shown in FIG. 16. The first bellows part 121 has valley parts 121a and mountain parts 121b. Further, a second bellows part 163 having a valley and a mountain may be formed also in the regulation part 16. By so doing, the movement in the height direction of the electronic substrate 200 can be restricted by inserting the electronic substrate 200 into the valley parts of the respective bellows parts. Specifically, the electronic substrate 200 is inserted into the valley parts of the respective bellows parts by pressing the electronic substrate 200 to the side of the cover 100 in the state of completely inserting the electronic substrate 200 until the end in the longitudinal direction of the electronic substrate 200 abuts on the regulation part 16. Moreover, the insertion into the valley parts by pressure can be facilitated by configuring the respective bellows parts with resilient members such as springs.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. An electronic apparatus comprising:
   an electronic substrate on which an electronic component is mounted; and
   a cover that retains the electronic substrate, which is inserted along its plate surface direction, wherein:
   the cover includes:
      a tabular flat plate part;
      a first guide part protruding from the tabular flat plate part and extending out to be inclined relative to a planar direction of the tabular flat plate part; and
      a second guide part that is located further away from the tabular flat plate part than the first guide part and that extends out in a direction opposite from a direction in which the first guide part extends out in the planar direction to be inclined relative to the planar direction;
   an insertion opening, into which the electronic substrate is capable of being inserted, is formed between the second guide part and the first guide part;
   the first guide part and the second guide part are arranged to be shifted from each other in the planar direction;
   the second guide part is located further in an insertion direction, in which the electronic substrate is inserted, than the first guide part;
   the tabular flat plate part includes an antenna seat part where an antenna that sends and receives radio waves is disposed;

the antenna seat part includes an upright wall part and an antenna installation part; and the antenna seat part is disposed further in the insertion direction than the second guide part.

2. The electronic apparatus according to claim 1, wherein the electronic substrate includes a penetrating part, which passes through the electronic substrate in its thickness direction and in which the first guide part is capable of being disposed.

3. The electronic apparatus according to claim 1, wherein:
a plurality of rear-surface electronic components are mounted as the electronic component on a rear surface of the electronic substrate that is opposed to the tabular flat plate part in a state where the electronic substrate is retained by the cover; and
a protruding height of the first guide part in a normal direction of the cover is larger than a height of an electronic component of the plurality of rear-surface electronic components that is the highest in the normal direction.

4. The electronic apparatus according to claim 1, wherein:
the cover includes a pair of third guide parts that are arranged on both sides of a virtual axis line of the cover along the insertion direction; and
the pair of third guide parts respectively includes:
upright parts erecting from the tabular flat plate part in a normal direction of the cover; and
inclined parts each of which is formed continuously with a corresponding one of the upright parts and a distance between which increases in a direction separating from the tabular flat plate part along the normal direction of the cover.

5. The electronic apparatus according to claim 1, wherein:
the cover includes a regulation part that restricts displacement of the electronic substrate in a normal direction of the cover; and
the regulation part is formed at an end portion of the tabular flat plate part in the insertion direction.

6. The electronic apparatus according to claim 1, wherein:
a small electronic component, and a large electronic component larger in size than the small electronic component are mounted on the electronic substrate as the electronic component; and
the first guide part is disposed further in the insertion direction than the large electronic component in a state where the electronic substrate is retained by the cover.

7. The electronic apparatus according to claim 1, wherein:
the first guide part is bent and protrudes from the tabular flat plate part in a normal direction of the tabular flat plate part, and extends out to be inclined relative to the planar direction of the tabular flat plate part; and
an inclined plane of the first guide part closer to the second guide part in the planar direction of the tabular flat plate part, and the second guide part define the insertion opening.

* * * * *